United States Patent
Wagner

[11] Patent Number: 5,785,116
[45] Date of Patent: Jul. 28, 1998

[54] FAN ASSISTED HEAT SINK DEVICE

[75] Inventor: Guy R. Wagner, Loveland, Colo.

[73] Assignee: Hewlett-Packard Company, Palo Alto, Calif.

[21] Appl. No.: 593,185

[22] Filed: Feb. 1, 1996

[51] Int. Cl.[6] .................................................. F28F 7/00
[52] U.S. Cl. .................. 165/80.3; 165/124; 165/123; 165/122; 257/722; 361/697; 361/696
[58] Field of Search ........................ 165/80.3, 185, 165/122, 124, 125; 257/721, 722; 361/694, 695, 696, 697

[56] References Cited

U.S. PATENT DOCUMENTS

| | | |
|---|---|---|
| 3,592,260 | 7/1971 | Berger .................................. 361/696 X |
| 3,686,533 | 8/1972 | Garnier et al. . |
| 4,194,556 | 3/1980 | Watanabe et al. . |
| 4,233,644 | 11/1980 | Hwang et al. . |
| 4,489,363 | 12/1984 | Goldberg . |
| 4,541,004 | 9/1985 | Moore . |
| 4,546,405 | 10/1985 | Hultmark et al. . |
| 4,611,238 | 9/1986 | Lewis et al. . |
| 4,620,216 | 10/1986 | Horvath . |
| 4,639,829 | 1/1987 | Ostergren et al. . |
| 4,662,830 | 5/1987 | Pottebaum . |
| 4,682,651 | 7/1987 | Gabuzda . |
| 4,715,430 | 12/1987 | Arnold et al. . |
| 4,733,293 | 3/1988 | Gabuzda . |
| 4,812,733 | 3/1989 | Tobey . |
| 4,884,631 | 12/1989 | Rippel .................................. 257/722 X |
| 4,970,579 | 11/1990 | Aridt et al. . |
| 5,000,254 | 3/1991 | Williams . |
| 5,019,880 | 5/1991 | Higgins, III . |
| 5,029,236 | 7/1991 | Yasuda et al. . |
| 5,191,230 | 3/1993 | Heung . |
| 5,272,599 | 12/1993 | Koenen . |
| 5,287,249 | 2/1994 | Chen . |
| 5,288,203 | 2/1994 | Thomas . |
| 5,297,617 | 3/1994 | Herbert . |
| 5,299,632 | 4/1994 | Lee . |
| 5,309,983 | 5/1994 | Bailey . |
| 5,335,722 | 8/1994 | Wu . |
| 5,353,863 | 10/1994 | Yu . |
| 5,377,745 | 1/1995 | Hsieh .................................. 361/695 X |
| 5,409,352 | 4/1995 | Lin ...................................... 257/722 X |
| 5,445,215 | 8/1995 | Herbert ............................... 361/697 X |
| 5,484,262 | 1/1996 | Thomas et al. . |

(List continued on next page.)

FOREIGN PATENT DOCUMENTS

| | | |
|---|---|---|
| 2743708 | 4/1979 | Germany . |
| 63-113460 | 7/1988 | Japan . |
| 402034993 | 2/1990 | Japan ................................... 361/694 |
| 286900 | 11/1990 | Japan . |
| 229492 | 10/1991 | Japan . |
| 406132434 | 5/1994 | Japan ................................... 361/697 |
| 2287837 | 9/1995 | United Kingdom . |
| 2303970 | 3/1997 | United Kingdom . |
| PCT/US92/08709 | 10/1992 | WIPO . |

OTHER PUBLICATIONS

Literature re Thermalloy TCM™ by Thermalloy, Inc.
"Velox Backgrounder" by Velox Computer Technology, Inc.
R. Mitchell, "The Experimental Step 486/50 Redefines Cool", *BYTE*, Dec. 1990.
"ICEJET™", 50 MHz 486 Computer System Board, By Velox Computer Technology, Inc.
Literature re Velox "ICECAP™" by Velox Computer Technology, Inc.

*Primary Examiner*—Denise L. Ferensic
*Assistant Examiner*—Christopher Atkinson

[57] ABSTRACT

A fan assisted heat sink cooling device is disclosed in which the heat sink assembly also forms the housing surrounding the fan. The housing is constructed of a plurality of cooling vanes which have elongated openings therebetween allowing air to pass between and cool the vanes. The vanes are angled in an approximately opposite manner to the orientation of the fan blades in order to minimize the noise generated by the cooling device when in operation. The cooling device operates in an extremely efficient manner by causing air to pass over the cooling vanes twice.

27 Claims, 8 Drawing Sheets

U.S. PATENT DOCUMENTS

| | | | |
|---|---|---|---|
| 5,502,618 | 3/1996 | Chiou | 361/695 |
| 5,504,650 | 4/1996 | Katsui et al. | 165/80.3 X |
| 5,519,575 | 5/1996 | Chiou | 257/722 X |
| 5,582,240 | 12/1996 | Widmayer | 257/722 X |
| 5,583,746 | 12/1996 | Wang | 361/697 |
| 5,609,202 | 3/1997 | Anderson et al. | 257/722 X |
| 5,629,560 | 5/1997 | Katsui et al. | 257/721 |
| 5,629,834 | 5/1997 | Kodama et al. | 361/695 |

FAN ASSISTED HEAT SINK DEVICE

FIELD OF THE INVENTION

The present invention relates generally to cooling devices and, more particularly, to a cooling device for removing heat from an integrated circuit device.

BACKGROUND OF THE INVENTION

Integrated circuit devices are increasingly being used in modern electronic applications. One prevalent example is the computer. The central processing unit or units of most computers, including personal computers, is constructed from an integrated circuit device.

During normal operation, integrated circuit devices generate significant amounts of heat. If this heat is not continuously removed, the integrated circuit device may overheat, resulting in damage to the device and/or a reduction in operating performance. In order to avoid such overheating, integrated circuit cooling devices are often used in conjunction with integrated circuit devices.

One such cooling device is a fan assisted heat sink cooling device. In such a device, a heat sink is formed of a material, such as aluminum, which readily conducts heat. The heat sink is usually placed on top of and in contact with the integrated circuit device. Due to this contact, heat generated by the integrated circuit is conducted into the heat sink and away from the integrated circuit.

The heat sink may include a plurality of cooling fins in order to increase the surface area of the heat sink and, thus, maximize the transfer of heat from the heat sink device into the surrounding air. In this manner, the heat sink draws heat away from the integrated circuit and transfers the heat into the surrounding air.

In order to enhance the cooling capacity of such a heat sink device, an electrically powered fan is often mounted on top of the heat sink. In operation, the fan causes air to move over and around the fins of the heat sink device, thus cooling the fins by enhancing the transfer of heat from the fins into the ambient air.

Over the years, as the power of integrated circuit devices has increased, so has the amount of heat generated by these devices. In order to adequately cool these higher powered integrated circuit devices, integrated circuit cooling devices with greater cooling capacities are required.

Conventionally, the cooling capacity of fan assisted heat sink cooling devices has been increased by making the devices larger. Specifically, cooling devices are often made larger by the incorporation of larger heat sinks and larger fans. This increase in size, however, has been found to present a problem. Increasing the size of the cooling device in a vertical direction (i.e. in a direction transverse to the orientation of the integrated circuit device) is often a problem because of the limited envelope available in many applications, such as in the computer case of a desktop personal computer. This is an even greater problem because, in most situations, a fairly substantial clearance area is required between the fan opening and the computer case to allow adequate airflow into or out of the fan.

Increasing the size of the cooling device in a horizontal direction (i.e. in a direction parallel to the orientation of the circuit board) is also often a problem because this limits the number of integrated circuit devices (and other electronic devices) which may be incorporated into the computer case.

Another problem with fan assisted heat sink cooling devices is the noise generated by the fans, particularly in situations where larger fans are used to achieve increased cooling capacity. This is particularly a problem in desktop computers where a user is commonly in close proximity to the machine. The problem is further aggravated in situations where multiple integrated circuit devices, and, thus, multiple cooling devices, are mounted in the same computer case, as occurs in many high power computers.

Thus, it would be generally desirable to provide an apparatus which overcomes these problems associated with fan assisted heat sink devices.

SUMMARY OF THE INVENTION

The present invention is directed to a fan assisted heat sink cooling device primarily for cooling integrated circuits during operation.

The cooling device is provided with a heat sink assembly that also forms the housing surrounding the fan. In this manner, the vertical size of the cooling device is minimized. The housing is constructed of a plurality of cooling vanes which have elongated openings therebetween allowing air to pass between and cool the vanes.

The cooling device is also designed to generate significantly less noise while operating. To accomplish this, the cooling vanes are angled in an approximately opposite manner to the angle of the fan blades. It has been found that this configuration significantly reduces the noise generated by the cooling device.

The configuration of the cooling device causes it to operated in an extremely efficient manner. Because the fan housing is constructed from a series of vanes, air is caused to enter the housing through the housing wall as well as from the open top of the housing. Accordingly, the cooling device is able to operate with a much smaller overhead clearance. Also, air being exhausted from the cooling device is caused to pass over the housing vanes a second time, thus further enhancing heat dissipation.

Air is exhausted from the housing through a series of curved slots which are aligned with the orientation of the fan blades. This arrangement results in a highly efficient air flow path for increased cooling device efficiency.

The heat sink assembly may be integrally formed to prevent heat conductance losses ordinarily associated with joints. A large mass of heat conductive material is provided in the heat sink assembly immediately adjacent the integrated circuit device to enhance heat flow from the integrated circuit device into the heat sink.

DETAILED DESCRIPTION OF THE INVENTION

Figure 1:
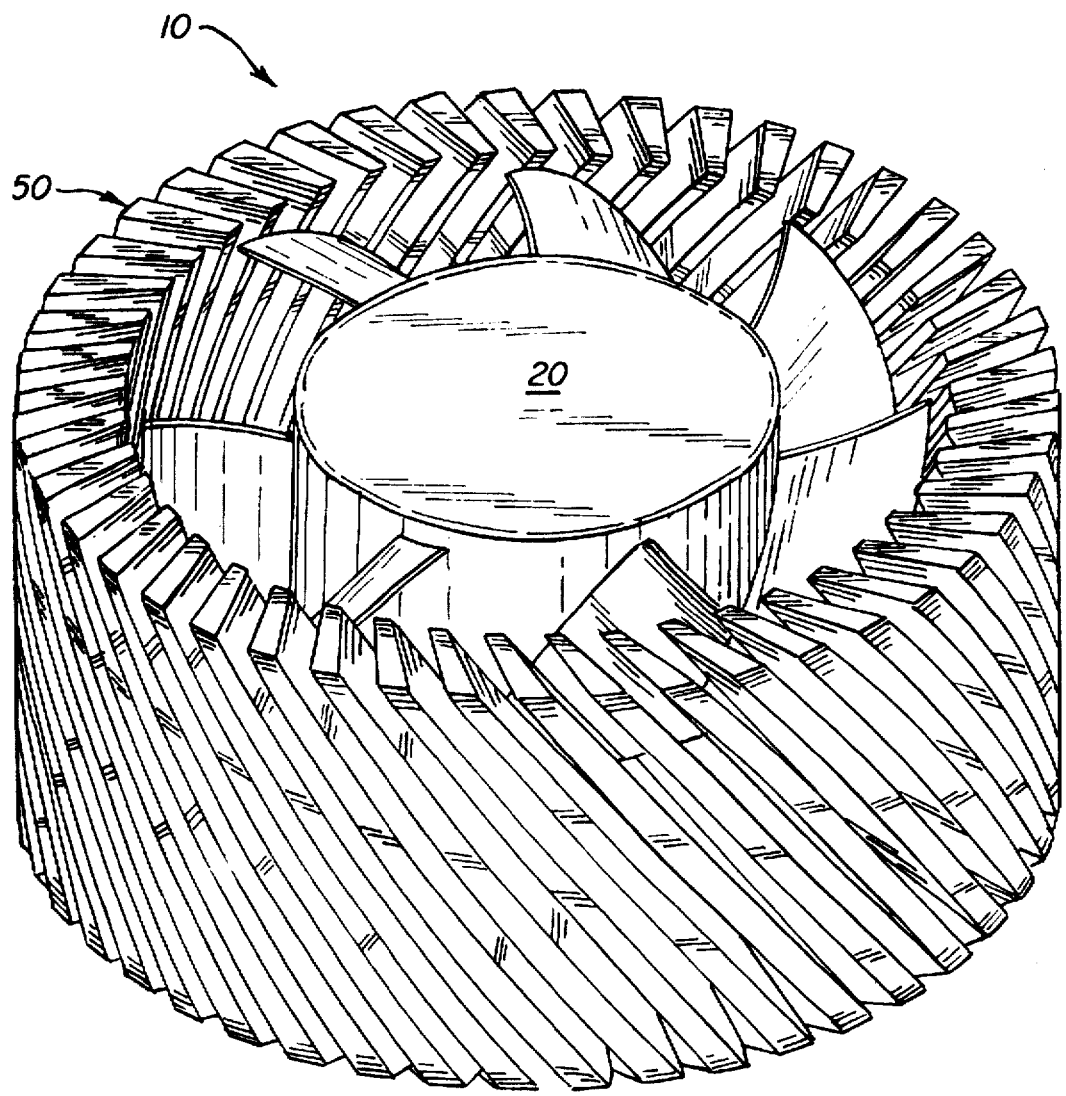
FIG. 1 is a front perspective view of a cooling device.

FIGS. 1–9, in general, illustrate a cooling device 10 for dissipating heat from a heat source 110. The cooling device 10 may include a substantially planar surface 54 adapted to contact the heat source 110 and a peripheral wall portion 82 which defines a chamber 84 therewithin. The chamber 84 may have a first open end 85 and a second closed end defined by a chamber wall portion 86. The cooling device may also include a heat conductive base portion 52 located between the planar surface 54 and the chamber wall portion 86. A plurality of openings 73 extend through the peripheral wall portion 82 and also into the base portion 52.

Figure 3:
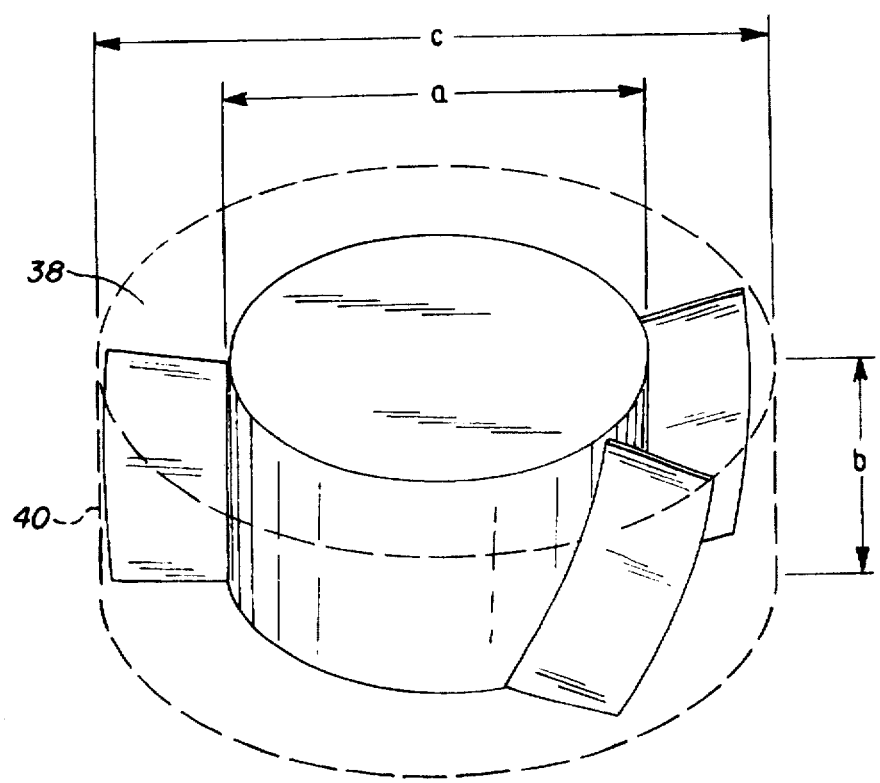
FIG. 3 is a schematic front perspective view of the volume swept by the fan blades of the fan assembly of FIG. 2.
Figure 4:
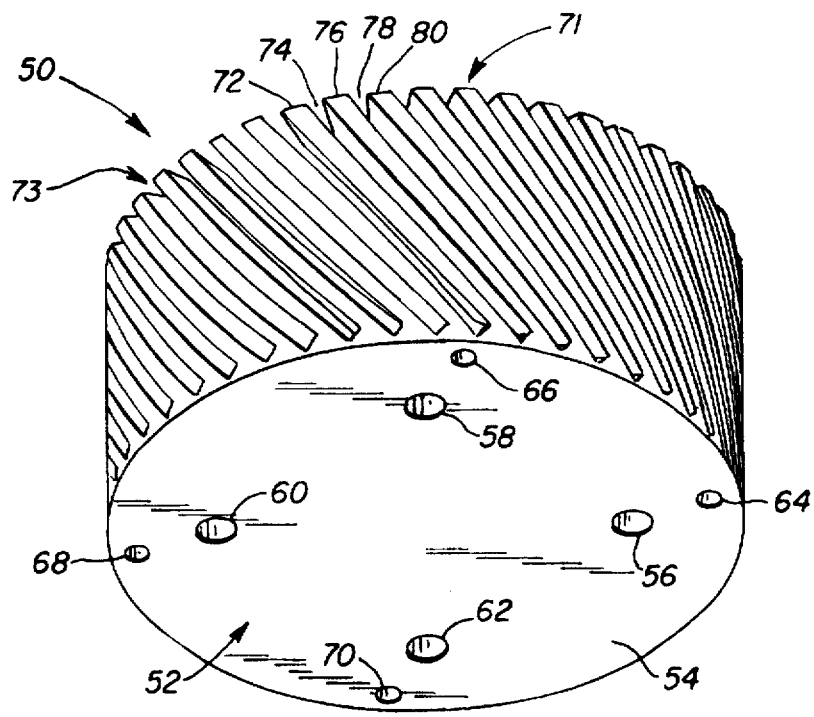
FIG. 4 is a bottom perspective view of a heat sink assembly used in the cooling device of FIG. 1.
Figure 5:
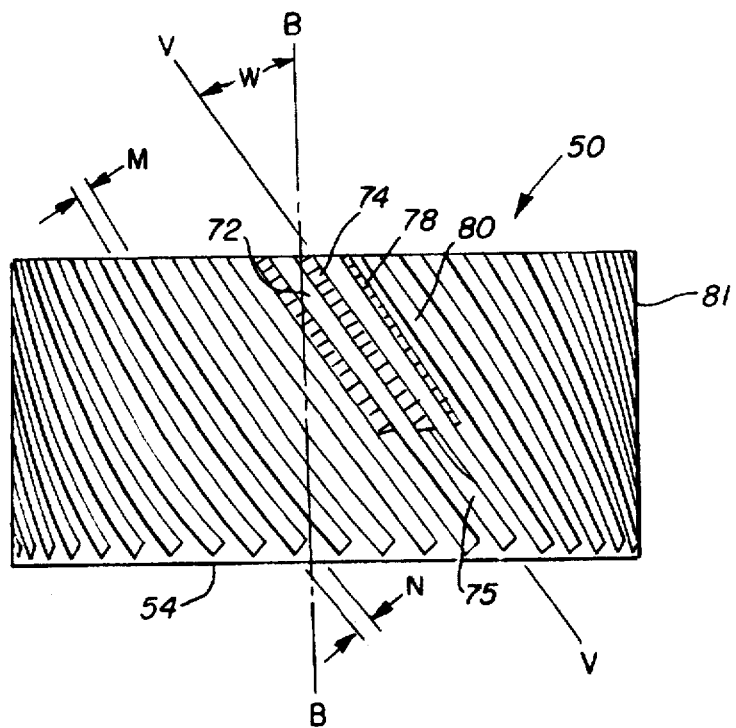
FIG. 5 is a side elevation view of the heat sink assembly of FIG. 4.

FIGS. 1–9 also illustrate, in general, a cooling device 10 for dissipating heat from a heat source 110, the cooling device 10 including a fan chamber 84 defined by a plurality of cooling vanes 71, each of the cooling vanes 71 having a central longitudinal axis "VV", FIG. 5, and a plurality of fan blades 21 rotatably mounted about a fan rotation axis "AA" within the fan chamber 84, each of the fan blades 21 having a fan blade orientation axis "FF". Each of the cooling vane central longitudinal axes "VV" forms an angle "Y" of between about 75 and 105 degrees with respect to the fan blade orientation axis "FF".

FIGS. 1–9 also illustrate, in general, a method of removing heat from a heat source 110 including the steps of providing a heat sink assembly 50 having an interface surface 54, a peripheral wall portion 82 defining a chamber 84 therewithin and a heat conductive base portion 52 located between the interface surface 54 and the chamber 84; contacting the heat source 110 with the interface surface 54; causing air 148, 150 to move into the chamber 84 through the peripheral wall portion 82; and causing air 144, 146 to move out of the chamber 84 through the base portion 52.

Having thus described the cooling device in general, the device will now be described in further detail.

Figure 2:
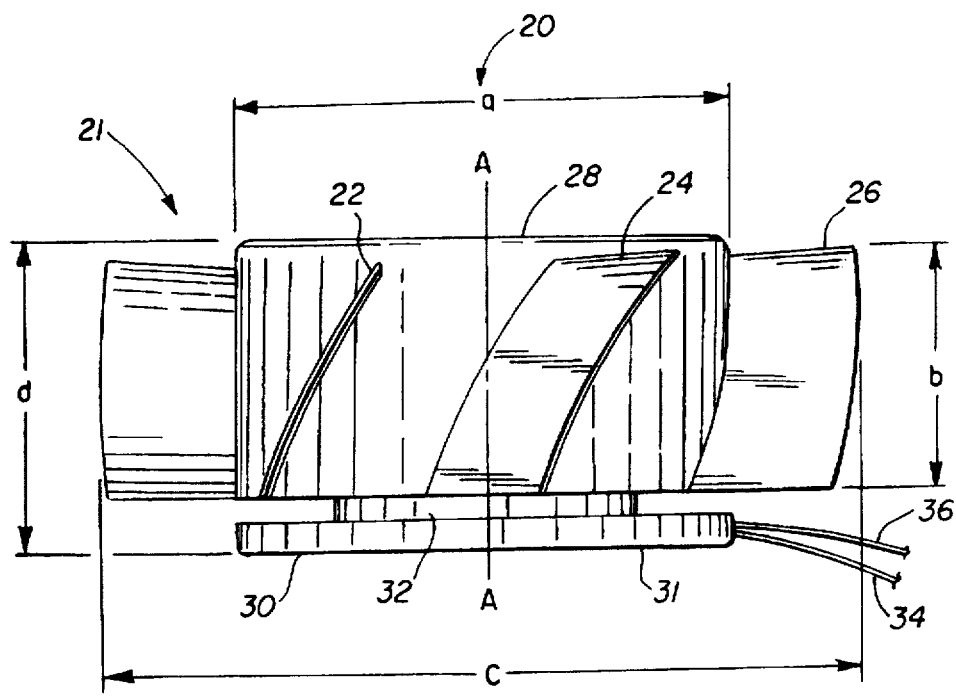
FIG. 2 is a front elevation view of a fan assembly used in the cooling device of FIG. 1.

FIG. 1 illustrates a cooling device 10 which includes a fan assembly 20 mounted within a heat sink assembly 50. As shown in FIG. 2, fan assembly 20 includes a plurality of fan blades 21, such as the individual blades 22, 24 and 26. The fan blades may be mounted on a hub assembly 28 which may, in turn, be rotatably mounted on the shaft 32 of a base member 30. Hub assembly 28 may be rotatably driven with respect to shaft 32 by a motor, not shown, located within the hub assembly 28. Fan assembly 20 has a central longitudinal axis "AA" which is also the axis about which the hub assembly 28 rotates when the fan assembly is activated. Electrical wires 34, 36 may enter the fan assembly 20 through the base member 30, as shown, in order to supply electric power to the fan assembly motor. A third wire, not shown, may optionally be connected to the fan assembly 20 in order to monitor fan rotation. In this manner, the integrated circuit device being cooled by the cooling device 10 may be shut down if the fan 20 fails to rotate at a specified speed, thus preventing overheating of the integrated circuit device.

Hub assembly 28 may have a diameter "a" of about 37 mm and may have a height "b" of about 15 mm which may be substantially the same as the height of the fan blades. The diameter "c" to the outside of the fan blades may be about 55 mm. The overall height "d" of the fan assembly 20 may be about 25 mm.

As schematically illustrated in FIG. 3, the fan blades, when rotating and viewed from above, define an annular area 38. Annular area 38 has an inside diameter equal to the hub assembly diameter "a" and an outside diameter equal to the fan blade diameter "c". Using the example dimensions listed above, this yields an annular area 38 having an inner diameter of about 37 mm, an outer diameter of about 55 mm and an area of approximately 13 square cm. The fan blades, when rotating, also define an annular volume 40. Annular volume 40 has a cross-sectional area identical to the area 38 described above and a height equal to the fan blade height "b". Using the example dimensions listed above, this yields an annular volume having a cross-sectional area of approximately 13 square cm, a height of about 15 mm and a volume of approximately 19.5 cubic cm.

The annular volume 40 described above, which also may be referred to herein as the "blade swept space", is defined by the rotation of the fan blades 21 as illustrated in FIG. 3.

The fan assembly motor may be a 12 volt DC brushless motor. The fan assembly 20 may be of the type commercially available from Matsushita Electric Company of Japan, sold as Model FBA06A12H and under the trade name "PANAFLO" (with its housing removed).

Figure 6:
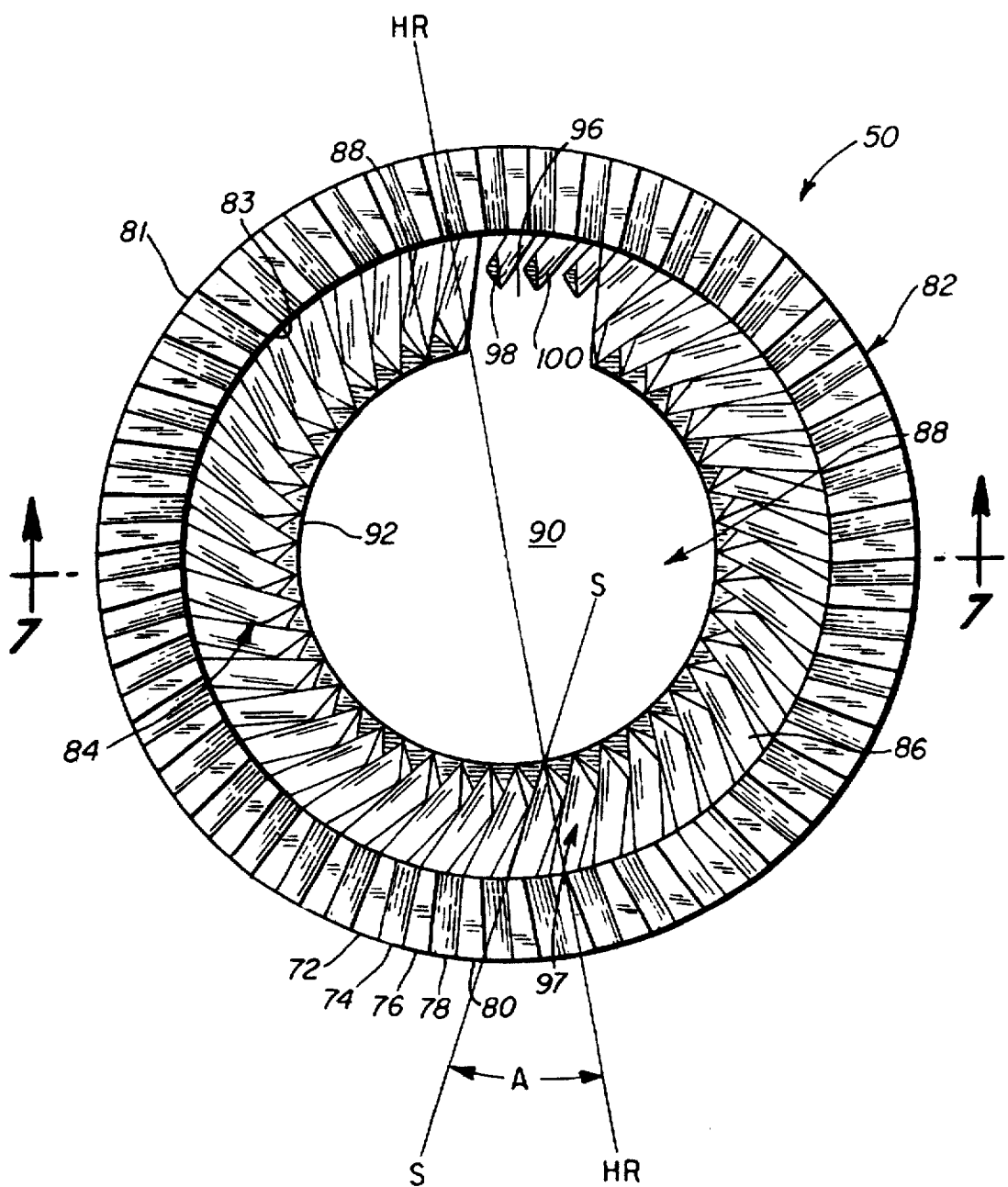
FIG. 6 is a top plan view of the heat sink assembly of FIG. 4.
Figure 7:
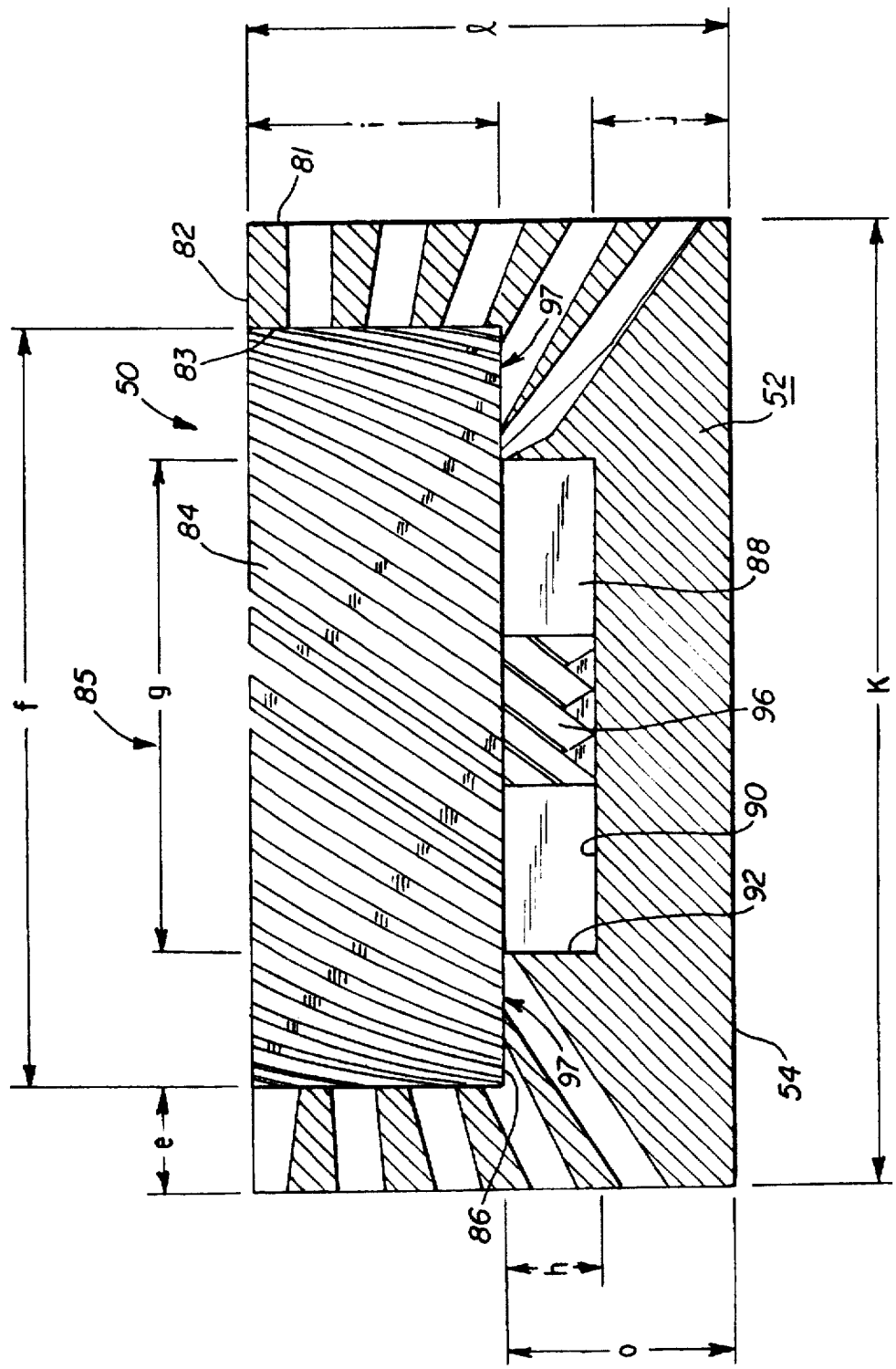
FIG. 7 is a cross section view of the heat sink assembly of FIG. 4 taken along the line 7—7 of FIG. 6.

Heat sink assembly 50 is shown in further detail in FIGS. 4–7. Heat sink assembly 50 may be of generally cylindrical shape, and may have an outside diameter "k" of about 73 mm and a height "1" of about 36 mm. FIG. 7. Heat sink assembly 50 may be formed from any heat conductive material, such as aluminum or copper. Heat sink assembly 50 includes a heat conductive base portion 52 having a lower surface 54, FIG. 4. Heat sink assembly base portion 52 may have a diameter which is equal to the diameter "k" of the heat sink assembly and a height "o" of about 16 mm, FIG. 7. Base portion lower surface 54 may contain a plurality of bores 56, 58, 60, 62, FIG. 4. These bores may be provided to allow clearance for projections which sometimes exist on electronic components such as the component 110, FIG. 8. A plurality of threaded openings 64, 66, 68, 70 may also be provided in lower surface 54.

Extending upwardly from the base portion 52 is an annular wall portion 82, FIGS. 6 and 7. As can be seen from FIG. 7, annular wall portion 82 may have a thickness "e" of about 7.65 mm and a height "i" of about 20 mm. Annular wall portion 82 has an outer surface 81, which forms part of the outer surface of the heat sink device 50, and an inner surface 83.

A generally cylindrically shaped fan chamber 84 is located within the annular wall portion 82, with the outer wall of the fan chamber 84 being defined by the annular wall portion inner surface 83. The upper end of fan chamber 84, as viewed in FIG. 7, may comprise an opening 85. The lower end of fan chamber 84 may be defined by a lower surface 86. Fan chamber 84 may have a diameter "f" of about 58 mm and a height "i" of about 20 mm.

A counterbore 88 may be provided in the center of fan chamber lower surface 86, extending downwardly into the base portion 52 of the heat sink assembly 50. Counterbore 88 includes a lower surface 90 and an upwardly extending circumferential sidewall 92, FIG. 7. Counterbore 88 may have a diameter "g" of about 38 mm and a height "h" of about 6 mm. As best shown in FIGS. 6 and 7, counterbore sidewall 92 may include a notch 96.

Referring to FIGS. 4–7, the outer periphery of heat sink assembly 50 includes a plurality of angled slots 73, such as the individual slots 74 and 78. As best seen in FIG. 6, the slots, e.g., slots 74, 78, extend completely through the annular wall portion 82. A plurality of cooling vanes 71, such as the individual vanes 72, 76 and 80, are defined by the slots 73, such that there is a vane located between every two slots around the periphery of annular wall portion 82. As can be seen, the slots 73 open into the fan chamber 84 and allow air to move between the outside of the heat sink assembly 50 and the fan chamber 84 through the annular wall portion 82 as will be explained in more detail. As can be seen from FIG. 7, the slots 73 and vanes 71 also extend below the annular wall portion 82 and into the heat sink assembly base portion 52.

The configuration of the cooling vanes 71 making up the heat sink annular wall portion 82 will now be described in detail. The size of each of the cooling vanes 71 depends upon the number of vanes forming the annular wall portion 82 and upon the width "N" of the slots 73, FIG. 5. It is pointed out that, although the drawing figures show a specific number of vanes and slots for illustration purposes, any number of vanes and slots may be used in the cooling device 10. A preferred configuration, which has been found to provide for efficient air flow and heat transfer, is described below. Such a configuration may be constructed having 45 cooling vanes, 45 slots, and be of a size as previously described.

Referring to FIG. 5, it can be seen that each of the cooling vanes 71, at the outer surface 81 of annular wall portion 82 may have a thickness "m" of about 2.2 mm, measured in a direction normal to the vane inclination. Each vane may taper to a thickness of about 1.35 mm at the inner edge 83 of annular wall portion 82, measured in a direction normal to the vane inclination.

Because the vanes taper toward the inner edge 83 of annular wall portion 82, the slots 73 may be formed having a relatively constant width across the annular wall portion 82. This constant width is important in providing for efficient air flow through the slots 73 between the exterior of cooling device 10 and the fan chamber 84. Each of the slots 73, may have a thickness "n" of about 2 mm, FIG. 5.

As can be seen from FIGS. 4 and 7, the slots 73 extend below annular wall portion 82 and into the heat conductive base portion 52. The slots in the base portion 52 define upwardly facing openings 97 in the fan chamber lower surface 86. The bottom portions of the slots 73 terminate in curved surface portions, such as the curved surface portion 75 shown in FIG. 5. These curved portions cause the airflow through the cooling device 10 to change from the vertical airflow path 138, 139 to the horizontal exhaust flow path 144, 146 as will be described in further detail with reference to FIG. 8. The provision of curved surfaces, such as the curved surface 75, allows for a smooth, energy efficient transition from the vertical airflow path 138, 139 to the horizontal airflow path 144, 146 and, thus, contributes to the overall efficiency of the cooling device 10.

When the fan assembly 20 is inserted into the heat sink assembly 50, as shown in FIG. 1, the fan assembly base member 30, FIG. 2, fits within the heat sink counterbore 88, FIG. 7. To securely fasten the fan assembly 20 to the heat sink assembly 50, a conventional adhesive may be applied to either the lower surface 31 of the fan assembly base member 30, FIG. 2, or to the lower wall 90 of the heat sink assembly counterbore 88, or to both. In this manner, the fan assembly base member 30 may be securely fastened within the heat sink counterbore 88 while allowing the fan blades 21 to rotate freely within the fan chamber 84. Alternatively, the fan 20 may be secured within the heat sink assembly 50 in any conventional manner.

The notch 96 is provided in the heat sink assembly counterbore 88 to allow clearance for the connection between the electrical wires 34 and 36 and the fan base member 30 when the fan assembly 20 is inserted into the heat sink assembly 50 as described above. The wires 34 and 36 may be passed through slots in the base 86, such as the slots 98, 100, in order to connect with a power source, not shown, located outside of the heat sink assembly 50.

When the fan assembly 20 is inserted into the heat sink assembly 50 as described above, the fan swept space 40, FIG. 3 is entirely located within the heat sink assembly fan chamber 84, FIGS. 6,7. Accordingly, the heat sink assembly annular wall portion 82 completely surrounds the fan swept space 40, acting as both a heat transfer surface and as a housing for the fan assembly 20. This configuration allows cooling device 10 to be very compact and efficient.

Figure 8:
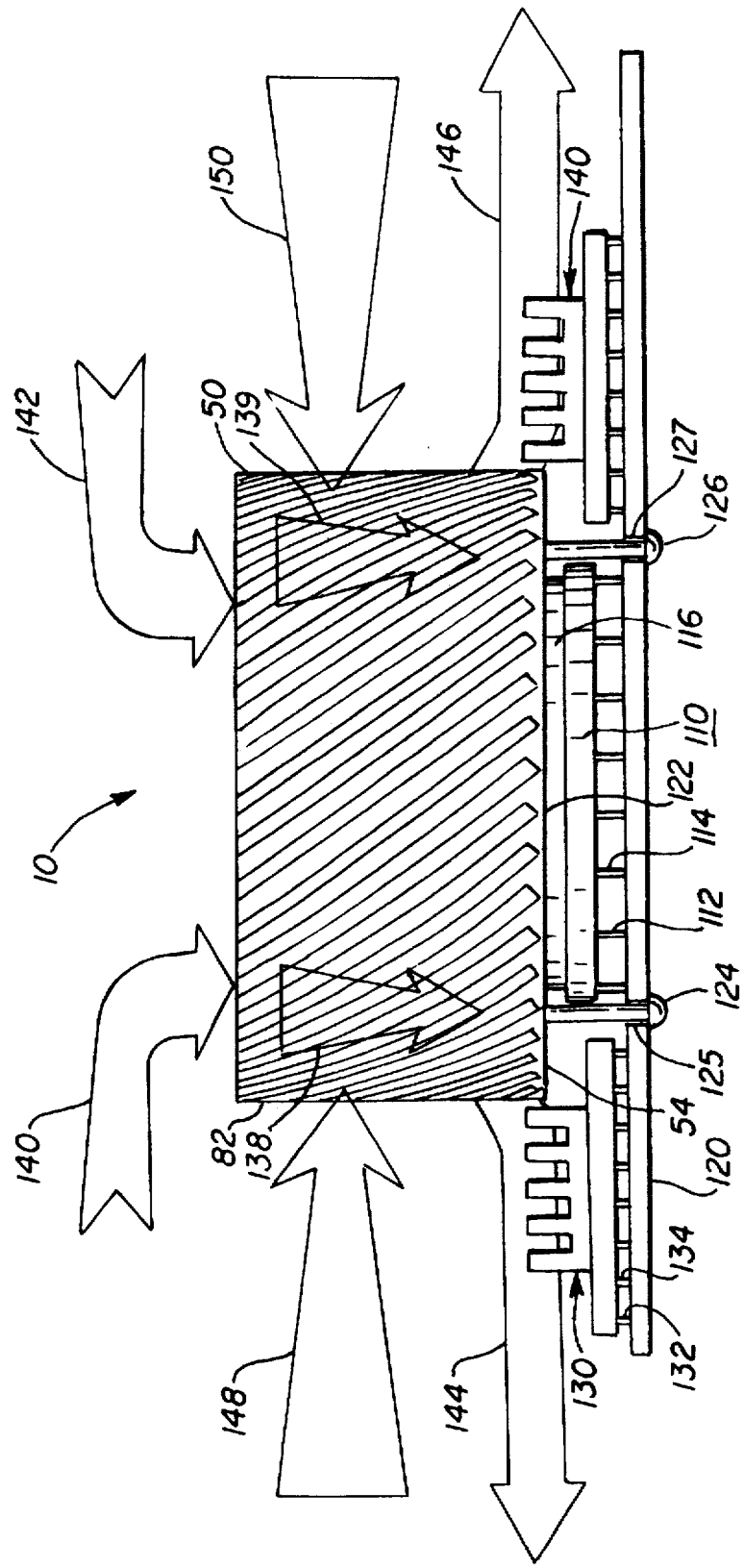
FIG. 8 is front elevation view of the cooling device of FIG. 1 mounted on an integrated circuit board.

FIG. 8 illustrates the cooling device 10 mounted for use in a typical component cooling application. In the example shown, a component 110 is mounted on a PC board 120. Component 110 may be, for example, a processor such as a central processing unit for use in personal computer and work station applications. Component 110 may be mounted to the PC board 120 via electrical connectors, such as the connectors 112, 114 in a conventional manner. In order to facilitate heat dissipation, component 110 may be provided with a lid 116 which is formed from a heat conductive material such as copper in a conventional manner.

Auxiliary components, such as those illustrated by the auxiliary components 130, 140, are often located in close proximity to primary components such as the component 110. Such auxiliary components may be mounted to the PC Board 120 as shown, for example by the connectors 132, 134 in a conventional manner.

During operation, electronic components such as the components 110, 130, 140 generate significant amounts of heat. This is particularly true with recently developed more powerful components such as many of the computer processors currently in use. In order to keep such components operating at peak efficiency and to avoid damage, overheating of the components must be avoided. To prevent such overheating, it is necessary to remove sufficient heat from the components during operation.

To accomplish heat removal from the primary component 110, cooling device 10 may be mounted directly on top of the component lid 116 so that the lower surface 54 of the heat sink assembly base portion 52 is in contact with the upper surface of the component lid 116, forming a joint 122 therebetween. In this manner, heat generated by the component 110 may be conducted through the component lid 116 and into the base portion 52 of the heat sink assembly 50. To facilitate heat transfer across the joint 122, a heat conductive substance, such as a heat conductive grease, may be applied between the lid 116 and the lower surface 54 of the heat sink base portion 52 in a conventional manner.

Heat sink assembly 50 may be securely fastened to the PC board by the use of threaded fasteners, such as the threaded fasteners 124 and 126 shown in FIG. 8. The fasteners 124, 126 pass through holes, such as the holes 125, 127 in the PC board and threadingly engage with threaded openings in the heat sink assembly 50, such as the threaded openings 64, 66, 68 and 70, FIG. 4. It is noted that, although four threaded fasteners may be used to secure the heat sink assembly 50 to the PC board, only two are shown in FIG. 8.

In this manner, the lower surface 54 of the heat sink assembly 50 may be tightly secured against the upper surface of the component lid 116, thus facilitating heat transfer between the two surfaces. Accordingly, heat is drawn away from the component 110 and into the relatively large base portion 52 of the heat sink assembly 50. The heat is then further conducted upwardly into the cooling vanes 71, FIG. 4.

In order to facilitate drawing heat away from the component 110, the heat sink assembly 50 may be provided with a large base portion 52 as shown in FIG. 7. As described previously, base portion 52 may have a diameter substantially equal to the diameter "k" of the heat sink assembly. Base portion 52 may also have a height "o" of approximately 16 mm. This relatively large height "o" provides a large mass of heat conductive material between the heat sink assembly lower surface 54 and fan chamber 84 and thus acts as a large heatsink, thus facilitating the removal of heat away from the component 110. Given the exemplary dimensions previously discussed, the height "o" of the base portion 52 may be about 45% of the total height "l" of the heat sink assembly 50. For efficient heat transfer, the height "o" of the base portion 52 should be at least 25% of the total height "l" of the heat sink assembly 50.

For efficient cooling, the heat, after being transferred into the base portion 52, must be further transferred into the cooling vanes 71 and then into the surrounding air. The ability of a heat sink device, such as heat sink assembly 50, to transfer heat into the air depends, among other things, upon the amount of surface area of the heat sink device exposed to the surrounding air. The cooling vanes 71 facilitate such heat transfer by effectively increasing the surface area of the heat sink device 50.

In operation, fan 20 may rotate in a counter-clockwise direction, as viewed, for example, in FIG. 1. Referring to FIG. 8, this counter-clockwise fan rotation will cause air movement in the general direction of the arrows 138, 139. Specifically, intake air from the exterior of cooling device 10 will enter the heat sink assembly fan chamber 84 through the heat sink assembly opening 85, FIG. 7. This air movement is indicated by the arrows 140, 142 in FIG. 8. After entering the fan chamber 84, the air moves downwardly, in a direction aligned with the arrows 138, 139 through the fan swept space 40, FIG. 3, toward the fan chamber lower surface 86, FIG. 7. Continuing its downward movement, the air enters the lower portion of the slots 73 through upwardly facing openings 97, FIG. 7, in the fan chamber lower surface 86. The air then travels down the lower portion of the slots 73 and exhausts from the cooling device as indicated by the arrows 144 and 146, FIG. 8. After exiting the cooling device 10, the horizontal airflow path 144, 146 moves over and thus serves to cool auxiliary components, such as the components 130, 140, located adjacent the component 110.

As the air moves through the lower portion of the slots 73, as described above, it also moves between the lower portions of the associated vanes 71, located in the base portion 52, thereby cooling the vanes and removing heat from the heat sink assembly 50.

The airflow 138, 139 moving through the fan chamber 84, results in a Bernoulli effect as it passes the slots 73. This Bernoulli effect induces an additional intake airflow, as indicated by the arrows 148 and 150, FIG. 8. The airflow 148, 150 comprises air moving from the exterior of the cooling device 10, through the upper portion of the slots 73 and into the fan chamber 84. The airflow 148, 150 then joins the airflow 140, 142 to form the airflow 138, 139 previously described.

By using the Bernoulli effect, the cooling device 10 is able to cause more air movement through the device than would be possible with a conventional configuration. Specifically, to provide for the Bernoulli effect described above, the annular wall 82 of the fan chamber 84 is provided with the slots 73. The movement of the airflow 138, 139 past the slots 73 causes the Bernoulli effect and thus results in the increased air movement previously described.

As the airflow 148, 150 moves through the upper portion of the slots 73, as described above, it also moves between the upper portions of the associated vanes 71, thereby providing additional cooling of the vanes 71, located in the annular wall portion 82, and removal of heat from the heat sink assembly 50.

As can be appreciated from the above description, each vane 71 of the cooling device 10 is cooled by two separate airflows. First, airflow 148, 150 moves past an upper portion of the vanes 71 to cool the vanes. Thereafter, the airflow 144, 146 moves past a lower portion of the vanes 71 to further cool the vanes. Accordingly, a portion of the air moving through the cooling device 10 is used twice for cooling; once on intake making up the airflow 148, 150 and a second time on exhaust partially making up the airflow 144, 146.

As described above, the cooling device 10 is able to obtain intake air both from the opening 85 and from the slots 73 surrounding the fan chamber 84. Because the cooling device 10 does not rely solely on the fan chamber opening 85 for intake air, the clearance provided above the cooling device 10 is less critical than with conventional designs. It has been found, for example, that the cooling device will operate efficiently with a clearance of as little as 2 mm above the opening 85. This ability to operate in low clearance applications is an extremely advantageous feature which allows the cooling device 10 to be used in space sensitive applications and, particularly, in applications where the dimension normal to the orientation of the pc board 120 is limited.

Specifically, the cooling device 10, constructed according to the exemplary dimensions previously described, has a measured thermal resistance of about 0.35 degrees C. per watt with infinite clearance above the opening 85. In a conventional manner, this thermal resistance was measured as the difference between the temperature of the lower surface 54 and the ambient air divided by the watts of heat energy being produced by the heat source (e.g., component 110). When a solid plate is placed approximately 2 mm above the opening 85, the measured thermal resistance of the cooling device 10 degrades only to about 0.38 degrees C. per watt. Accordingly, it can be appreciated that the thermal resistance of the cooling device 10 drops only about 9% when the vertical clearance above the opening 85 is reduced to about 2 mm.

Referring to FIG. 5, it can be seen that the heat sink assembly 50 has a central longitudinal axis "BB", which is normal to the plane of the heat sink assembly lower surface 54 and which is also colinear with the fan assembly rotational axis "AA" when the fan assembly 20 is mounted within the heat sink assembly 50 as described above. With further reference to FIG. 5, it can be seen that each of the vanes 71 has a central longitudinal axis "VV". Each vane central longitudinal axis "VV" is inclined at an angle "w" with respect to the heat sink central longitudinal axis "BB". Because the slots 73 define the vanes 71, each slot also has a central longitudinal axis which is inclined at the same angle "w" with respect to the heat sink central longitudinal axis "BB".

Figure 9:
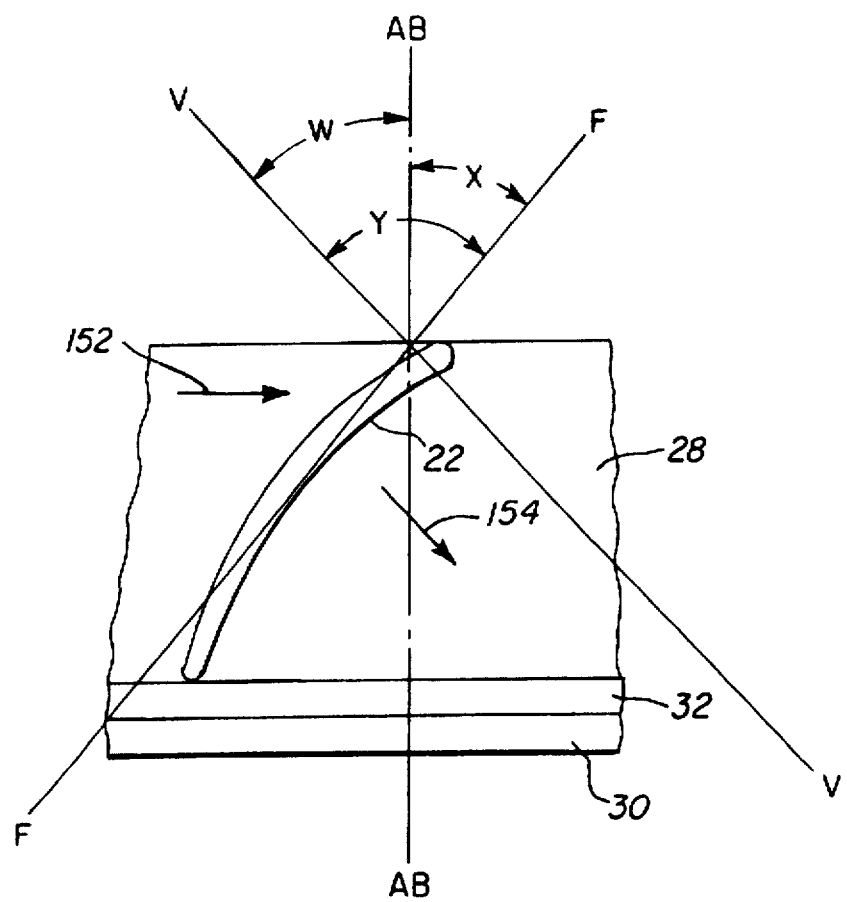
FIG. 9 is a cut-away detail view of a portion of the fan assembly of FIG. 2.

It has been found that the vane inclination described above is instrumental in reducing the noise produced by the cooling device 10 when in operation. FIG. 9 illustrates the configuration of a single blade 22 of the fan assembly 20. The blade 22 has an orientation axis "FF" which is inclined at an angle "x" with respect to the fan assembly central longitudinal axis "AA" in a conventional manner. When the fan assembly hub 28 rotates in a counter-clockwise direction, the blade 22 moves generally in the direction of the arrow 152 in FIG. 9. Because of the inclination of the blade 22 described above, this movement results in air movement in a direction indicated by the arrow 154. The direction indicated by the arrow 154 is substantially perpendicular to the blade orientation axis "FF".

Also shown, superimposed on FIG. 9 is the vane central longitudinal axis "VV" and the heat sink central longitudinal axis "BB". As previously described, the heat sink central longitudinal axis "BB" is colinear with the fan assembly rotational axis "AA" when the fan assembly 20 is mounted within the heat sink assembly 50. As can be seen, the vane central longitudinal axis "VV" forms an angle "w" with respect to both the fan assembly rotational axis "AA" and the heat sink central longitudinal axis "BB" as previously described. As can further be seen, the vane central longitudinal axis "VV" also forms an angle "y" with respect to the blade orientation axis "FF". As can be appreciated from an examination of FIG. 9, adding the angles "w" and "x" always results in the angle "Y".

It has been found that, when the cooling device 10 is in operation, the noise produced by the cooling device is significantly affected by the angle "y" between the vane central longitudinal axis "VV" and the blade orientation axis "FF". Fan noise is a significant problem associated with cooling devices such as the cooling device 10 described herein. Such noise is a particular problem in situations where larger and/or higher speed fans are used to achieve increased cooling capacity and in desktop computers where a user is commonly in close proximity to the machine. The noise problem is further aggravated in situations where multiple integrated circuit devices, and, thus, multiple cooling devices, are mounted in the same computer case, as occurs in many high power computers.

It has been found that the noise generated by cooling devices, such as the cooling device 10, is at a maximum when the angle "y" is equal to 0 degrees and that the noise is at a minimum when the angle "y" is equal to 90 degrees. Although the noise is minimized at an angle "y" of 90 degrees, acceptable noise levels may be achieved using an angle "y" of between about 75 degrees and about 105 degrees.

As can be appreciated, given a fan blade angle "x" of about 55 degrees (as is typical in many conventional fans), the cooling vane angle "w" will have a range of between about 20 degrees and 50 degrees when the angle "y" has a range of between about 75 degrees and 105 degrees as described above. As can be further appreciated, the cooling vane angle "w" will be equal to about 35 degrees when the angle "y" is equal to about 90 degrees and the fan blade angle "x" is equal to about 55 degrees.

The vane angle configuration described above also results in another improvement to the operation of the cooling device 10 as will now be described in detail.

As previously described, the slots 73 in the heat sink assembly base portion 52 define upwardly facing openings 97 in the fan chamber lower surface 86, FIG. 6. These openings serve to provide an exhaust path for air exiting the fan chamber 84 during operation of the cooling device 10. The bottom portions of the slots 73 terminate in curved surfaces portions, such as the curved portion 75 shown in FIG. 5. These curved portions cause the airflow through the cooling device 10 to change from the vertical airflow path 138, 139 to the horizontal exhaust flow path 144, 146 as described previously with reference to FIG. 8.

Referring again to FIG. 9, it can be appreciated that the slots 73 in the base portion 52, as well as the upwardly facing openings 97, will be inclined at the same angle "y" with respect to the blade orientation axis "FF". As previously described, the airflow direction 154, FIG. 9, is oriented at approximately 90 degrees with respect to the blade orientation axis "FF". Accordingly, orienting the vane central longitudinal axis "VV" at approximately 90 degrees from the blade orientation axis "FF", as described previously, will result in the air flow direction 154 being substantially aligned with the vane central longitudinal axis "VV" and, accordingly, with the slots 73, which are formed at the same inclination as the vanes 71, as previously explained.

This alignment of the air flow direction 154 and the exhaust openings 97 and slots 73 results in a straight, smooth exhaust path for the air leaving the fan chamber 84. This configuration, thus, contributes to the efficiency of the cooling device 10 by reducing air flow shock losses that might otherwise be encountered in a conventional device.

Referring to FIG. 6, it can be seen that the heat sink assembly 50 has a bisector line "HR—HR" which is perpendicular to the heat sink central longitudinal axis "BB", FIG. 5. With further reference to FIG. 6, it can be seen that each of the slots 97 in the lower surface 86 has a slot central longitudinal axis "SS". Each slot central longitudinal axis "SS" is inclined at an angle "A" with respect to the heat sink bisector line "HR—HR".

Figure 10:
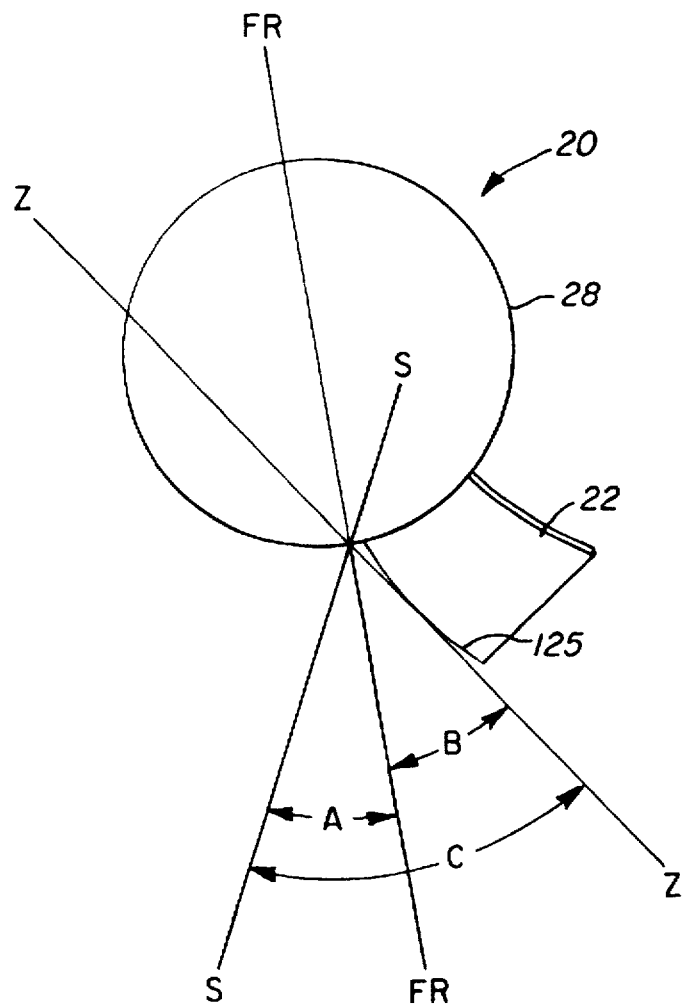
FIG. 10 is a partial plan view of the fan assembly of FIG. 2.

It has been found that the slot inclination described above is also instrumental in reducing the noise produced by the cooling device 10 when in operation. FIG. 10 illustrates the configuration of a single blade 22 of the fan assembly 20, as viewed from above. The fan assembly 20 has a bisector line "FR—FR" which is perpendicular to the fan assembly central longitudinal axis "AA", FIG. 2, and to the heat sink central longitudinal axis "BB", FIG. 5, when the fan assembly 20 is installed within the heat sink assembly 50 as previously described. The bottom portion 185 of the blade 22 has an orientation axis "ZZ" which is inclined at an angle "B" with respect to the fan assembly bisector line "FR—FR" in a conventional manner.

Also shown, superimposed on FIG. 10 is the slot central longitudinal axis "SS". As can be seen, slot central longitudinal axis "SS" forms an angle "C" with respect to the fan blade orientation axis "ZZ". As can be appreciated from an examination of FIG. 10, adding the angles "A" and "B" always results in the angle "C".

It has been found that, when the cooling device 10 is in operation, the noise produced by the cooling device is significantly affected by the angle "C" between the slot central longitudinal axis "SS" and the fan blade orientation axis "ZZ". It has been found that the noise generated by cooling devices, such as the cooling device 10, is at a maximum when the angle "C" is equal to 0 degrees and that the noise is at a minimum when the angle "C" is equal to 90 degrees. Although the noise is minimized at an angle "C" of 90 degrees, acceptable noise levels may be achieved using an angle "C" of between about 45 degrees and about 135 degrees.

It is noted that, in the cooling device constructed according to the exemplary dimensions previously set forth, the angle "C" may be about 60 degrees. As can be appreciated from an examination of FIGS. 6 and 10, increasing the angle "C" beyond about 60 degrees would also increase the angle "A" which would result in interference between adjacent openings 97. It has been found, however, that an angle "C" of 60 degrees provides sufficiently quiet operation.

It is also noted that other configurations of the cooling device may be utilized in which the angle "C" could be made to equal 90 degrees. An example would be a heat sink assembly 50 having a lesser number of slots and wider cooling vanes. Such a configuration, for example, would allow adequate clearance so that an angle "C" of 90 degrees could be used for maximum noise reduction.

Although the heat sink assembly 50 may be constructed in any conventional manner, a preferred method for its construction will now be described.

First, an extruded solid round bar of, e.g., aluminum, may be provided, having substantially the same diameter as the outside diameter "k" of the heat sink assembly, FIG. 7.

The cylinder may then be machined, e.g., with a lathe, to the exact outside diameter "k" of the heat sink assembly. A lathe may then again be used, in a conventional manner, to form the fan chamber 84, having a diameter "f" and the counterbore 88 having a diameter "g".

A conventional end milling operation may be used to form the notch 96, as shown in FIG. 7. The slots 73 may then be formed using a circular slitting saw. After the slitting saw is oriented at the desired slot and vane inclination angle "w" and rotation angle "A", successive slots may be cut, with the heat sink assembly being rotated an appropriate distance relative to the slitting saw between each cut.

A cylinder having a height substantially equal to the heat sink assembly height "l", FIG. 7, is then cut from the bar. After cutting the cylinder, the heat sink assembly lower surface 54 may be milled flat and smooth to facilitate reliable attachment to a heat source. Finally, the bores 56, 58, 60, 62 and threaded openings 64, 66, 68, 70 may be machined into the lower surface 54.

To form a heat sink assembly having the exemplary dimensions set forth herein, the slitting saw used may have a diameter of approximately 4.0 inches and a thickness of approximately 5/16 of an inch. As can be appreciated, the diameter of the slitting saw will dictate the curvature of the slot bottom curved surface portions 75, FIG. 5.

Forming the heat sink assembly 50 as described above results in a heat sink unit of integral configuration. This is advantageous to the efficient removal of heat from a heat source since any joints in the heat sink assembly would tend to compromise heat transfer ability.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A cooling device for dissipating heat from a heat source comprising:
   a) a substantially planar surface adapted to contact said heat source;
   b) a peripheral wall portion defining a chamber therewithin;
   c) said chamber having a first open end and a second closed end defined by a chamber wall portion;
   d) a heat conductive base portion located between said planar surface and said chamber wall portion;
   e) a plurality of openings extending through said peripheral wall portion, said openings also extending into said base portion;
   f) wherein said cooling device has a cooling device height measured in a direction substantially perpendicular to said planar surface;
   g) wherein said base portion has a base portion height measured between said planar surface and said chamber wall portion in a direction substantially perpendicular to said planar surface; and
   h) wherein said base portion height is at least about 25% of said cooling device height.

2. The cooling device of claim 1 further including an air movement device located in said chamber.

3. The cooling device of claim 2 wherein said air movement device comprises a fan.

4. The cooling device of claim 1 wherein said base portion height is approximately 16 mm.

5. The cooling device of claim 1 wherein said peripheral wall portion comprises a plurality of vanes having slots therebetween.

6. The cooling device of claim 5 wherein said slots form said openings extending through said peripheral wall portion.

7. The cooling device of claim 1 wherein said planar surface, said base portion and said peripheral wall portion are integrally formed.

8. A cooling device for dissipating heat from a heat source, said cooling device comprising:
   a) a substantially planar surface adapted to contact said heat source;
   b) a cooling device central axis which is substantially perpendicular to said planar surface;
   c) a chamber located within said cooling device;
   d) a plurality of cooling vanes surrounding said chamber; and
   e) wherein for each of said cooling vanes:
      a second axis exists which is parallel to said cooling device central axis and which intersects said cooling vane; and
      wherein said cooling vane is inclined with respect to said second axis.

9. The cooling device of claim 8 further including an air movement device located in said chamber.

10. The cooling device of claim 9 wherein said air movement device comprises a fan.

11. The cooling device of claim 8 further including a heat conductive base portion located between said planar surface and said chamber.

12. The cooling device of claim 11 wherein said cooling vanes also substantially surround said base portion.

13. The cooling device of claim 8 wherein each of said vanes is inclined with respect to said second axis at an angle of between about 20 degrees and about 50 degrees.

14. The cooling device of claim 8 wherein each of said vanes is inclined with respect to said second axis at an angle of about 35 degrees.

15. A cooling device for dissipating heat from a heat source, said cooling device comprising:
   a) a fan chamber defined by a plurality of cooling vanes, each of said cooling vanes having a central longitudinal axis;
   b) a plurality of fan blades rotatably mounted about a fan rotation axis within said fan chamber, each of said fan blades having a fan blade orientation axis; and c) wherein each of said cooling vane central longitudinal axes forms an angle of between about 75 degrees and about 105 degrees with respect to said fan blade orientation axis.

16. The cooling device of claim 15 wherein each of said cooling vane central longitudinal axes is substantially perpendicular to said fan blade orientation axis.

17. The cooling device of claim 15 further including a substantially planar surface adapted to contact said heat source and a heat conductive base portion located between said planar surface and said fan chamber.

18. The cooling device of claim 17 wherein said cooling vanes substantially surround said base portion.

19. A method of removing heat from a heat source comprising the steps of:

a) providing a heat sink assembly having an interface surface, a peripheral wall portion defining a chamber therewithin and a heat conductive base portion located between said interface surface and said chamber;

b) contacting said heat source with said interface surface;

c) causing air to move into said chamber through said peripheral wall portion; and d) causing air to move out of said chamber through said base portion.

20. The method of claim 19 wherein said steps of causing air movement are performed by an air movement device located within said chamber.

21. The method of claim 20 wherein said air movement device is a fan.

22. The method of claim 19 wherein said peripheral wall portion comprises a plurality of vanes having slots therebetween.

23. The method of claim 22 wherein said slots form openings between the exterior of said heat sink assembly and said chamber.

24. The method of claim 19 wherein said heat sink assembly is formed of a metallic material.

25. The method of claim 24 wherein said metallic material is aluminum.

26. The method of claim 24 wherein said metallic material is copper.

27. The method of claim 19 wherein said heat sink assembly is integrally formed.

* * * * *

UNITED STATES PATENT AND TRADEMARK OFFICE
Certificate

Patent No. 5,785,116                                                                           Patented: July 28, 1998

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of the patent is: Arlen L. Roesner, Fort Collins, CO; Guy R. Wagner, Loveland, CO.

Signed and Sealed this Sixth Day of March, 2001.

IRA S. LASARUS
*Supervisory Patent Examiner*
Art Unit 3743